(12) United States Patent
Yang et al.

(10) Patent No.: US 8,638,626 B2
(45) Date of Patent: Jan. 28, 2014

(54) ROW ADDRESS CONTROL CIRCUIT SEMICONDUCTOR MEMORY DEVICE INCLUDING THE SAME AND METHOD OF CONTROLLING ROW ADDRESS

(75) Inventors: Hui-Kap Yang, Hwaseong-si (KR); Woo-Seop Jeong, Hwaseong-si (KR); Chul-Sung Park, Seocho-gu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 141 days.

(21) Appl. No.: 13/237,353

(22) Filed: Sep. 20, 2011

(65) Prior Publication Data

US 2012/0106283 A1 May 3, 2012

(30) Foreign Application Priority Data

Nov. 2, 2010 (KR) ........................ 10-2010-0107903

(51) Int. Cl.
 *G11C 7/00* (2006.01)
(52) U.S. Cl.
 USPC .......................................... 365/201; 365/222
(58) Field of Classification Search
 USPC ........ 365/201, 230.06, 222, 236, 239, 230.02
 See application file for complete search history.

(56) References Cited

U.S. PATENT DOCUMENTS

| | | | | |
|---|---|---|---|---|
| 5,299,168 A | * | 3/1994 | Kang | 365/222 |
| 5,502,677 A | * | 3/1996 | Takahashi | 365/201 |
| 5,625,597 A | * | 4/1997 | Hirose | 365/201 |
| 5,777,942 A | * | 7/1998 | Dosaka et al. | 365/230.03 |
| 5,959,925 A | * | 9/1999 | Tatsumi | 365/222 |
| 6,633,504 B1 | * | 10/2003 | Lee et al. | 365/222 |
| 2002/0023193 A1 | * | 2/2002 | Nakamura | 711/106 |
| 2005/0117402 A1 | * | 6/2005 | Kim | 365/189.05 |
| 2005/0286331 A1 | * | 12/2005 | Ito et al. | 365/222 |
| 2008/0239853 A1 | * | 10/2008 | Chun | 365/222 |

FOREIGN PATENT DOCUMENTS

| | | |
|---|---|---|
| JP | 2001093278 A | 4/2001 |
| KR | 20060020285 A | 3/2006 |
| KR | 20090126976 A | 12/2009 |

* cited by examiner

*Primary Examiner* — Douglas King
(74) *Attorney, Agent, or Firm* — Harness, Dickey & Pierce, P.L.C.

(57) ABSTRACT

A row address control circuit of a semiconductor memory device including dynamic memory cells includes a test mode setting unit, an address counter and a row address generating unit. The test mode setting unit is configured to provide a test mode signal that indicates whether a test operation is performed or not, in response to a test command; the address counter is configured to generate a first address that increases gradually; and the row address generating unit is configured to selectively choose one of the first address and a second address as a refresh address based on the test mode signal, the second address being externally provided.

18 Claims, 8 Drawing Sheets

ROW ADDRESS CONTROL CIRCUIT SEMICONDUCTOR MEMORY DEVICE INCLUDING THE SAME AND METHOD OF CONTROLLING ROW ADDRESS

CROSS-REFERENCE TO RELATED APPLICATIONS

This application claims priority under 35 USC §119 to Korean Patent Application No. 10-2010-0107903, filed on Nov. 2, 2010 in the Korean Intellectual Property Office (KIPO), the entire contents of which are incorporated herein by reference.

BACKGROUND

1. Technical Field

Example embodiments relate to semiconductor devices, and more particularly to a row address control circuit, a semiconductor memory device including the same and a method of controlling row addresses of a semiconductor memory device.

2. Description of the Related Art

In general, DRAM cells, which are used in area requiring high speed data transmission, includes dynamic cells, each having a cell capacitor and a cell transistor which switches the cell capacitor. In the dynamic cells, refresh operation needs to be performed periodically. Recently, semiconductor memory devices have been developed for handling such refresh operation internally.

However, when the semiconductor memory devices handle the refresh operation internally, such semiconductor memory devices may have lower operating speed. In addition, there may be some difficulties for testing precisely refresh timing in such semiconductor memory devices.

SUMMARY

Some example embodiments provide a row address control circuit capable of selecting a row address to be refreshed.

Some example embodiments provide a semiconductor memory device including the row address control circuit.

Some example embodiments provide a method of controlling a row address of a semiconductor memory device capable of selecting a row address to be refreshed.

According to some example embodiments, a row address control circuit of a semiconductor memory device including dynamic memory cells includes a test mode setting unit, an address counter and a row address generating unit. The test mode setting unit may provide a test mode signal indicating whether a test operation is performed or not, in response to a test command. The address counter may generate a first address increasing gradually. The row address generating unit may selectively choose one of the first address and a second address as a refresh address, in response to the test mode signal. The second address may be externally provided.

In some embodiments, the row address generating unit may operate in a normal mode when the test mode signal has a first logic level, and the row address generating unit may operate in a test mode when the test mode signal has a second logic level.

The row address generating unit may include a selection circuit that selects the first address as the refresh address when the test mode signal has the first logic level, and selects the second address as the refresh address when the test mode signal has the second logic level.

The row address generating unit may further include a first switch that is turned on in response to an active command and transfers the second address; and a second switch that is turned on in response to a refresh command and transfers the refresh address output from the selection circuit.

The selection circuit may include a multiplexer which has a first input terminal receiving the first address, a second input terminal receiving the second address and a control terminal receiving the test mode signal.

The selection circuit may include an inverter that receives the test mode signal; a first AND gate that receives an output of the inverter and the first address; a second AND gate that receives the test mode signal and the second address; and an OR gate that receives outputs of the first and second AND gates.

A refresh operation based on a refresh command and an active operation based on an active command may be performed on a same bitline when the test mode signal has the second logic level.

According to some example embodiments, a semiconductor memory device includes a memory cell area including a plurality of dynamic memory cells; a refresh circuit that generates a refresh command; and a row address control circuit. The row address control circuit generates a refresh address for performing refresh operation on the memory cell area, in response to the refresh command. The row address control circuit may select a first address in a normal mode and selects a second address in a test mode. The first address may be an address that is generated in the row address control circuit, and the second address may be an address that is input to the row address control circuit externally.

In some embodiments, the memory cell area may be divided into a plurality of banks, each of the banks may include a plurality of memory blocks, and the plurality of memory blocks may each be associated with same bitlines and share a sense amplifier.

In some embodiments, the refresh circuit may be a hidden refresh circuit which generates the refresh command autonomously without regard to an external command.

In some embodiments, the row address control circuit may include a test mode setting unit that provides a test mode signal in response to a test command; and a row address generating unit that selectively chooses one of the first address and a second address as a refresh address in response to the test mode signal.

The row address generating unit may operate in the normal mode when the test mode signal has a first logic level, and the row address generating unit may operate in the test mode when the test mode signal has a second logic level.

In some embodiments, the row address generating unit outputs the second address in response to an active command.

The refresh address generated for the refresh operation and an address generated for an active operation may designate a same memory block.

According to some example embodiments, in a method of controlling refresh address of a semiconductor memory device including dynamic memory cells, a test mode signal may be generated in response to a test command. One of an external address and an internal address may be selectively chosen as a refresh address in based on a test mode signal. A refresh operation is performed on a memory block corresponding to the refresh address. Active operation is performed on the memory block to determine whether the memory block has defects or not.

In some embodiments, the internal address may be selected as the refresh address when the test mode signal has a first logic level, and the external address may be selected as the refresh address when the test mode signal has a second logic level.

According to some example embodiments, a row address control circuit of a semiconductor memory device including dynamic memory cells may include a row address generating unit configured to receive a first signal, and to selectively choose one of a first address and a second address as a refresh address based on the first signal. The first address may be an address generated based on an internal counting operation, and the second address may be an externally provided address.

The row address control circuit may further include an address counter configured to perform the counting operation, and to generate the first address based on the counting operation; and a test mode setting unit configured to generate a test mode signal in response to a test command. The test mode signal may indicate whether a test operation is to be performed or not. The test mode signal may be the first signal.

According to some example embodiments, a semiconductor memory device may include a memory cell area including a plurality of dynamic memory cells; and a row address control circuit configured to generate a refresh address for performing a refresh operation on memory cells from among the plurality of dynamic memory cells. The row address control circuit may be configured to select a first address in a normal mode and configured to select a second address in a test mode. The first address may be internally generated. The second address may be input to the row address control circuit externally.

The semiconductor device may further include a refresh circuit configured to generate the refresh command.

According to some example embodiments, a method of controlling refresh address of a semiconductor memory device including dynamic memory cells may includes electively choosing one of an externally received address and an internally generated address as a refresh address based on a test mode signal; and performing a refresh operation on a memory block corresponding to the refresh address.

The method may further include generating the test mode signal in response to a test command; and performing an active operation on the memory block after performing the refresh operation to determine whether the memory block has defects or not.

Accordingly, example embodiments may control the row address to be refreshed externally in the test mode, and thus, are capable of decreasing test time and enhancing performance by performing test with a reduced or minimum timing margin.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
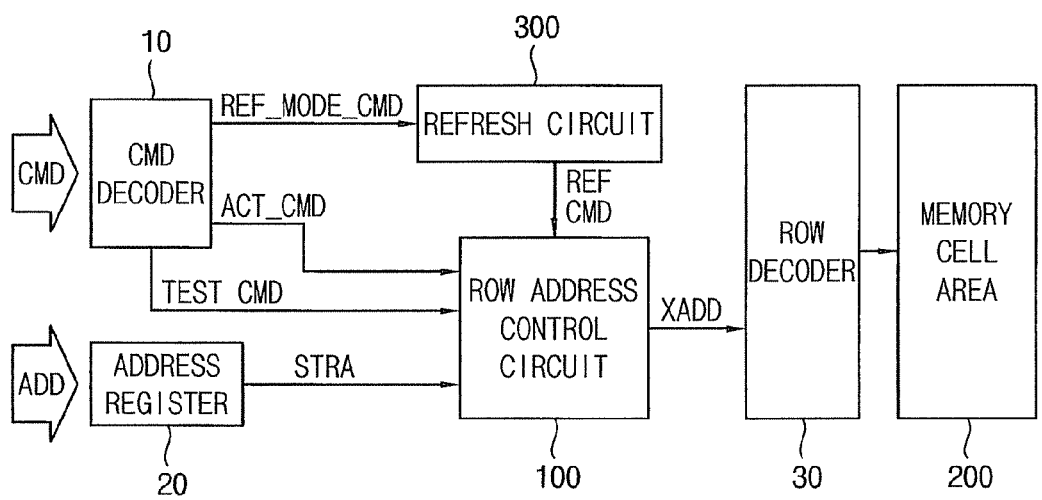
FIG. 1 is a block diagram illustrating a semiconductor memory device according to some example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor memory device according to some example embodiments.

Referring to FIG. 1, a semiconductor memory device 5 includes a command decoder 10, an address register 20, a row decoder 30, a row address control circuit 100, a memory cell area 200 and a refresh circuit 300.

The command decoder 10 decodes a command CMD externally received (for example, from a memory controller), and transmits the decoded command to corresponding circuits. For example, the command decoder 10 may transmit an active command ACT_CMD for read and write operation and a test command TEST_CMD for test operation to the row address control circuit 100. In addition, the command decoder 10 may transmit a refresh mode command REF_MODE_CMD to the refresh circuit 300. The refresh circuit 300 may transmit a refresh command REF_CMD to the row address control circuit 100 in response to the refresh mode command REF_MODE_CMD.

The refresh circuit 300 may set a refresh mode one of a self refresh mode and an auto-refresh mode in response to the refresh mode command REF_MODE_CMD. However, some memory devices such as UtRAM or UcRAM may perform hidden refresh operation without receiving command associated refresh operation from a memory controller.

The address register 20 decodes address signal ADD to provide an external address STRA (or second address) to the row address control circuit 100.

The row address control circuit 100 receives the external address STRA, the refresh command REF_CMD, the active command ACT_CMD, the test command TEST_CMD to provide a selected row address XADD to the row decoder 30. The row decoder 30 enables wordlines corresponding to the row address XADD. When the wordlines are enabled, data of memory cells connected to the enabled wordlines are sensed by a sense amplifier (not illustrated) through corresponding bitlines, and sensed data are amplified to be stored in the memory cells connected to the enabled wordlines (refresh operation).

The memory cell area 200 includes a plurality of banks, and each of the banks includes a memory cell array including dynamic memory cells formed in area intersected by wordlines and bitlines. The refresh operation needs to be performed periodically on all of the dynamic memory cells.

Figure 2:
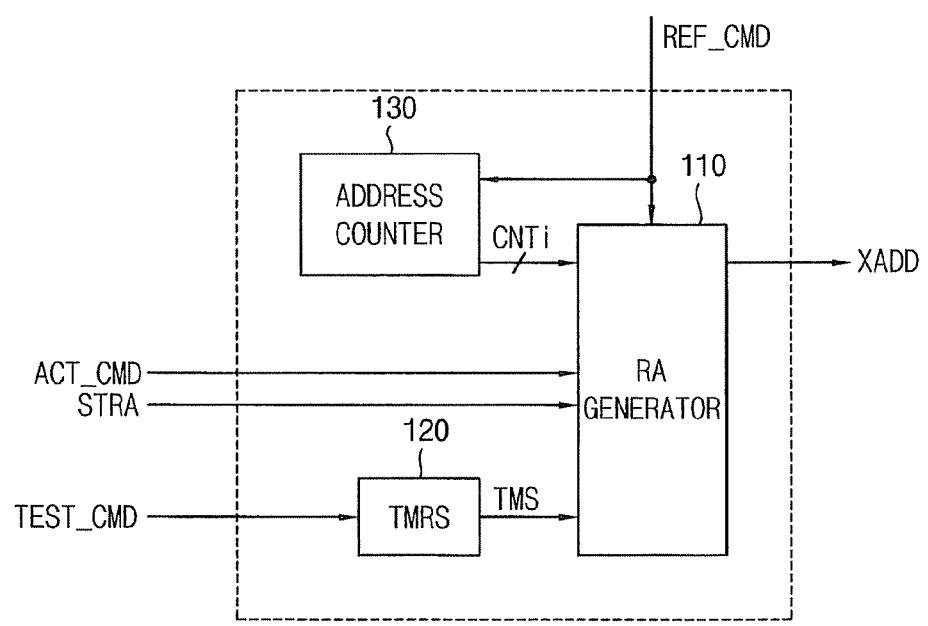
FIG. 2 is a block diagram illustrating an example of the row address control circuit in FIG. 1 according to some example embodiments.

FIG. 2 is a block diagram illustrating an example of the row address control circuit in FIG. 1 according to some example embodiments.

Referring to FIG. 2, a row address control circuit 100 may include a row address generating unit 110, a test mode setting unit (TMRS; Test mode register set) 120 and an address counter 130.

The test mode setting unit 120 generates the test mode signal TMS in response to the test command TEST_CMD from the command decoder 10. When the test command TEST_CMD represents a test inactivation, the test mode signal TMS has a first logic level and the row address control circuit 100 operates in a normal mode. When the test command TEST_CMD represents a test activation, the test mode signal TMS has a second logic level and the row address control circuit 100 operates in a test mode.

The address counter 130 generates internal addresses CNTi increasing gradually for performing refresh operation in response to the refresh command REF_CMD from the refresh circuit 300.

When general semiconductor memory devices changes from a self refresh mode while counting addresses for performing self refresh operation to an auto-refresh mode, a same address counter which counted the addresses for performing self refresh operation starts counting addresses from last address which the address counter generates when the semiconductor memory devices changes from the self refresh mode to the auto-refresh mode. Therefore, the general semiconductor memory devices may not easily set or control refresh addresses externally. In addition, in some memory devices such as UtRAM or UcRAM which supports refresh operation without receiving external refresh command and timing margins are very important between hidden refresh and active command and precharge command, it is very difficult to perform precise refresh test because it is not possible to control row addresses on which the refresh operation is performed.

However, the row address control circuit 100 may control the row addresses in the refresh operation by including the test mode setting unit 120. The row address generating unit 110 receives the refresh command REF_CMD from the refresh circuit 300, the active command ACT_CMD from the command decoder 10 and the test mode signal TMS from the test mode setting unit 120. The row address generating unit 110 selects one of the external address STRA (second address) from the address register 20 and the internal address (first address) CNTi from the address counter 130 as the row address XADD to the row decoder 30, in response to the refresh command REF_CMD, the active command ACT_CMD and the test mode signal TMS. That is, the row address generating unit 110 may selectively choose one of the external address STRA and the internal address CNTi based on the test mode signal TMS.

Figure 3:
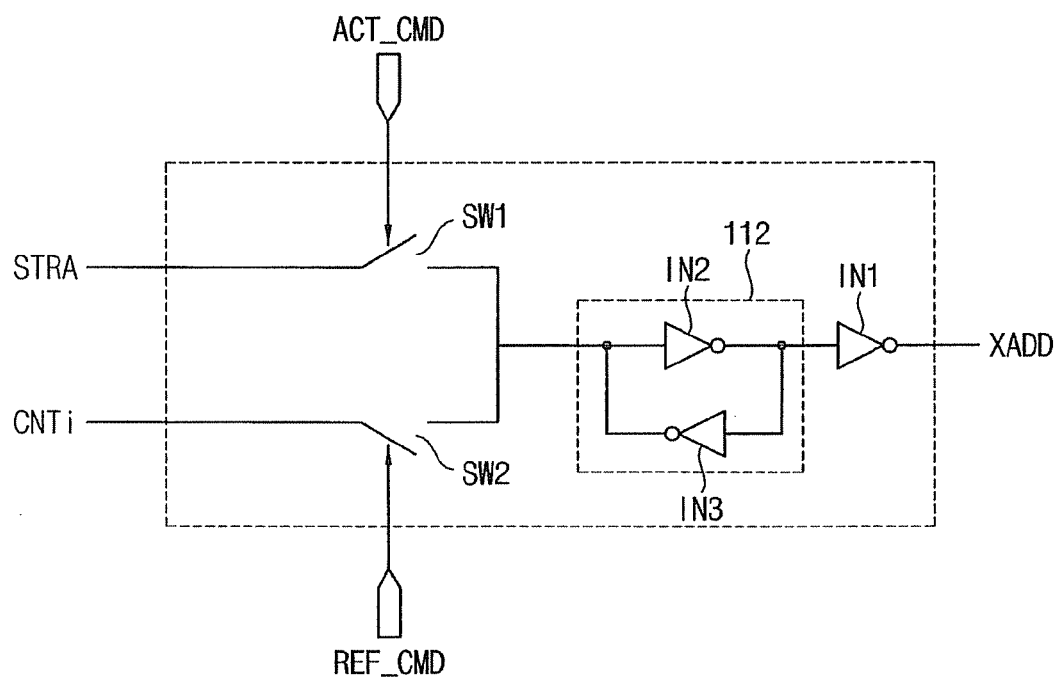
FIG. 3 is a circuit diagram illustrating an example of the row address generating unit when the row address control circuit does not include the test mode setting unit.

FIG. 3 is a circuit diagram illustrating an example of the row address generating unit when the row address control circuit does not include the test mode setting unit.

Referring to FIG. 3, a row address generating unit 110a includes first and second switches SW1 and SW2, a latch circuit 112 and an inverter IN1. The latch circuit 112 includes inverters IN2 and IN3 which are back-to-back connected with respect to each other.

When the active command ACT_CMD is applied to the first switch SW1, the first switch SW1 is electrically connected and the external address STRA is selected. The selected external address STRA is provided to the row decoder 30 as the row address XADD through the latch circuit 112 and the inverter IN1.

When the refresh command REF_CMD is applied to the second switch SW2, the second switch SW2 is electrically connected and the internal address CNTi is selected. The selected internal address CNTi is provided to the row decoder 30 as the row address XADD through the latch circuit 112 and the inverter IN1.

When the refresh operation is performed using the row address generating unit 110a of FIG. 3, internal addresses to be refreshed are generated in the address counter 130, and thus the internal addresses to be refreshed may not be controlled externally.

Figure 4:
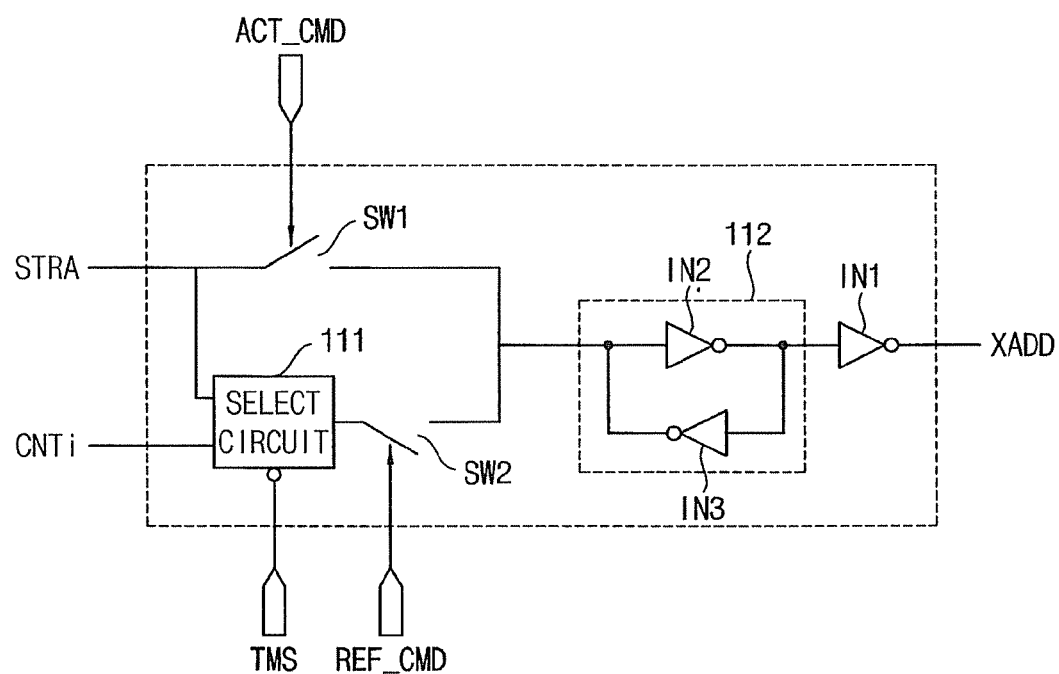
FIG. 4 is a circuit diagram illustrating an example of the row address generating unit in FIG. 2 according to some example embodiments.

FIG. 4 is a circuit diagram illustrating an example of the row address generating unit in FIG. 2 according to some example embodiments.

Referring to FIG. 4, a row address generating unit 110b includes first and second switches SW1 and SW2, a selection circuit 111, a latch circuit 112 and an inverter IN1. The row address generating unit 110b receives the test mode signal TMS from the test mode setting unit 120 in FIG. 2. The test mode signal TMS may indicate test activation or test inactivation according to logic level of the test mode signal TMS. For example, when the test mode signal TMS has a first logic level (logic low level), the test mode signal TMS may indicate the test inactivation. Therefore, when the test mode signal TMS has a first logic level (logic low level), the test mode signal TMS may be a test disable signal. For example, when the test mode signal TMS has a second logic level (logic high level), the test mode signal TMS may indicate the test activation. Therefore, when the test mode signal TMS has a second logic level (logic high level), the test mode signal TMS may be a test enable signal.

When the refresh command REF_CMD is applied to the second switch SW2, the second switch SW2 is electrically connected, and the selection circuit 120 one of the internal address CNTi and the external address STRA according to the logic level of the test mode signal TMS.

For example, when the test mode signal TMS has the first logic level (when the test mode signal TMS indicates the test inactivation), the selection circuit 111 selects the internal address CNTi, and the selected internal address CNTi is provided to the row decoder 30 as the row address XADD through the latch circuit 112 and the inverter IN1. For example, when the test mode signal TMS has the second logic level (when the test mode signal TMS indicates the test activation), the selection circuit 111 selects the external address STRA, and the selected external address STRA is provided to the row decoder 30 as the row address XADD through the latch circuit 112 and the inverter IN1.

Figure 5:
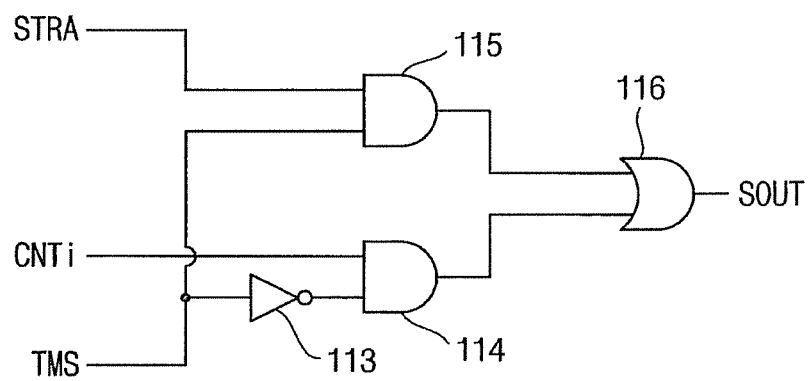
FIG. 5 is a circuit diagram illustrating an example of the selection circuit in FIG. 4 according to some example embodiments.

FIG. 5 is a circuit diagram illustrating an example of the selection circuit in FIG. 4 according to some example embodiments.

Referring to FIG. 5, a selection circuit 111a includes an inverter 113, first and second AND gates 114 and 115 and an OR gate 116. The inverter 113 receives the test mode signal TMS. The first AND gate 114 receives output of the inverter 113 and the internal address CNTi to perform AND operation on the output of the inverter 113 and the internal address CNTi. The second AND gate 115 receives the external address STRA and the test mode signal TMS to perform AND operation on the external address STRA and the test mode signal TMS. The OR gate 116 perform OR operation on outputs of the first and second AND gates 114 and 115. For operating in the normal mode including read/write operation, the test mode signal TMS has the first logic level (logic low level). Therefore, the output of the second AND gate 115 is logic low level, and the output of the first AND gate 114 is the internal address CNTi. Accordingly, the output SOUT of the OR gate 116 is the internal address CNTi. That is, when the test mode signal TMS has the first logic level (logic low level), the internal address CNTi is selected by the selection circuit 111a.

For operating in the test mode, the test mode signal TMS has the second logic level (logic high level). Therefore, the output of the second AND gate 115 is the external address STRA, and the output of the first AND gate 114 is logic low level. Accordingly, the output SOUT of the OR gate 116 is the external address STRA. That is, when the test mode signal TMS has the second logic level (logic high level), the external address STRA is selected by the selection circuit 111a.

Figure 6:
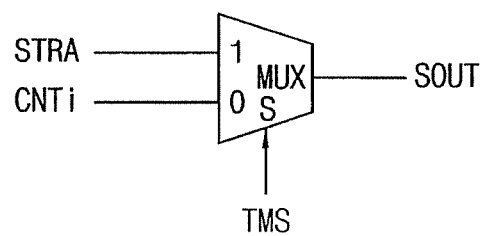
FIG. 6 is a circuit diagram illustrating another example of the selection circuit in FIG. 4 according to some example embodiments.

FIG. 6 is a circuit diagram illustrating another example of the selection circuit in FIG. 4 according to some example embodiments.

Referring to FIG. 6, a selection circuit 111b may include a 2-to-1 multiplexer MUX. The test mode signal TMS is applied to a control terminal of the multiplexer MUX. In addition, the multiplexer MUX has a first input terminal receiving the internal address CNTi and a second input terminal receiving the external address STRA. When the test mode signal TMS has the first logic level, the internal address CNTi is selected as the output signal SOUT. In addition, when test mode signal TMS has the second logic level, the external address STRA is selected as the output signal SOUT. That is, one of the internal address CNTi and the external address STRA is selected and is provided to the row decoder 30 in FIG. 1 according to the logic level of the test mode signal TMS. The row decoder 30 decodes the selected one of the internal address CNTi and the external address STRA, and the refresh operation is performed according to the decoded address. That is, when the test mode signal TMS has the first logic level indicating the test inactivation, the refresh operation is performed according to the internal address CNTi. In addition, when the test mode signal TMS has the second logic level indicating the test activation, the refresh operation is performed according to the external address STRA. Therefore, the refresh address may be controlled externally in the test mode.

Configuration of the selection circuit 111 is illustrated in FIGS. 5 and 6 just for explanation. The selection circuit 111 may have another configuration in other example embodiments.

Figure 7:
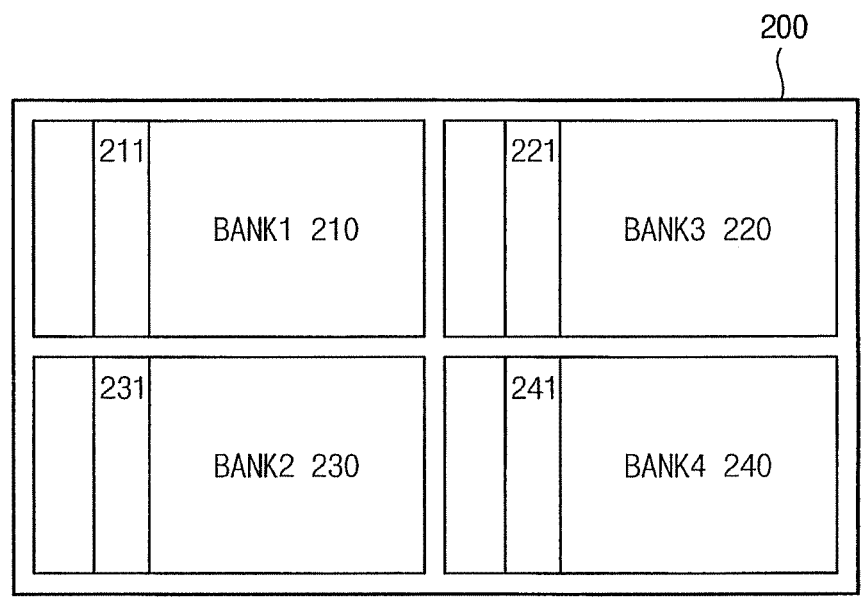
FIG. 7 is a block diagram illustrating an example of the memory cell area in FIG. 1 according to some example embodiments.

FIG. 7 is a block diagram illustrating an example of the memory cell area in FIG. 1 according to some example embodiments.

Referring to FIG. 7, the memory cell area 200 may be divided into a plurality of banks 210, 220, 230 and 240, and each of the banks 210, 220, 230 and 240 may include corresponding one of memory blocks 211, 212, 213 and 214. Each of the of memory blocks 211, 212, 213 and 214 uses same bitlines and shares a sense amplifier. In general, refresh operation is simultaneously performed on some memory blocks which have same addresses.

Figure 8:
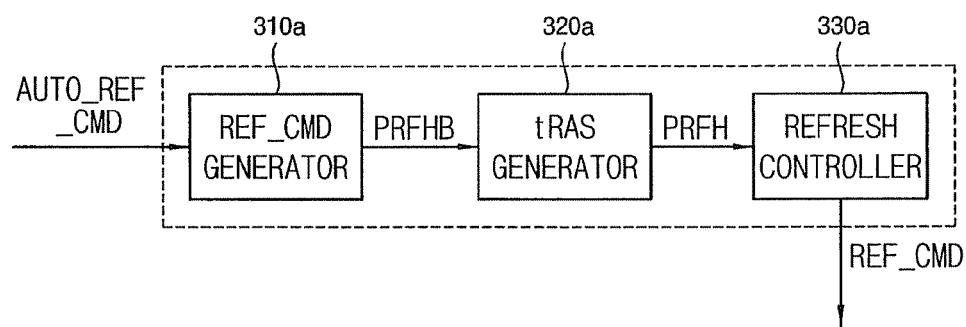
FIG. 8 is a block diagram illustrating an example of the refresh circuit in FIG. 1 according to some example embodiments.
Figure 9:
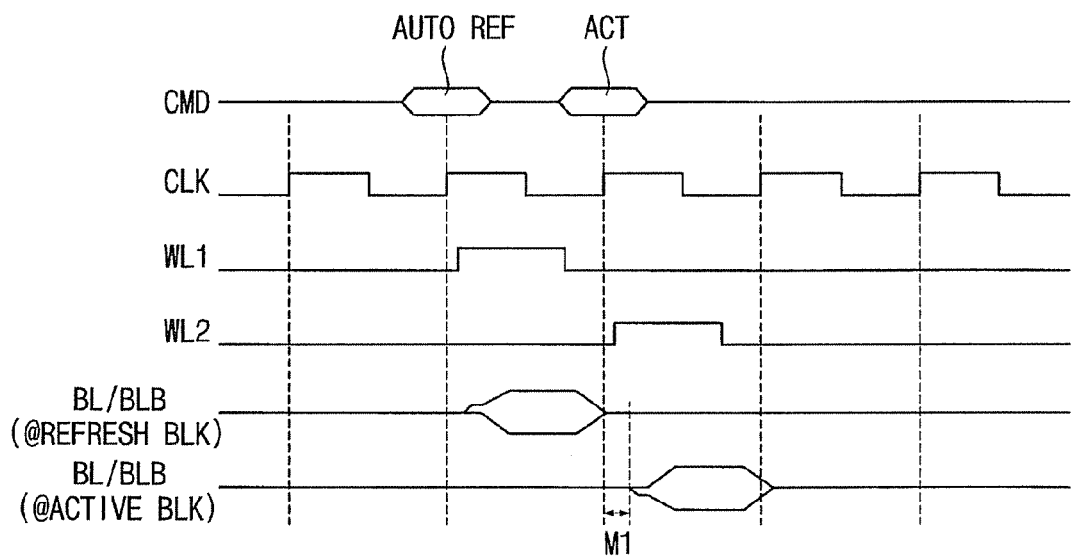
FIG. 9 is a timing diagram illustrating operation of the refresh circuit of FIG. 8 according to some example embodiments.
Figure 10:
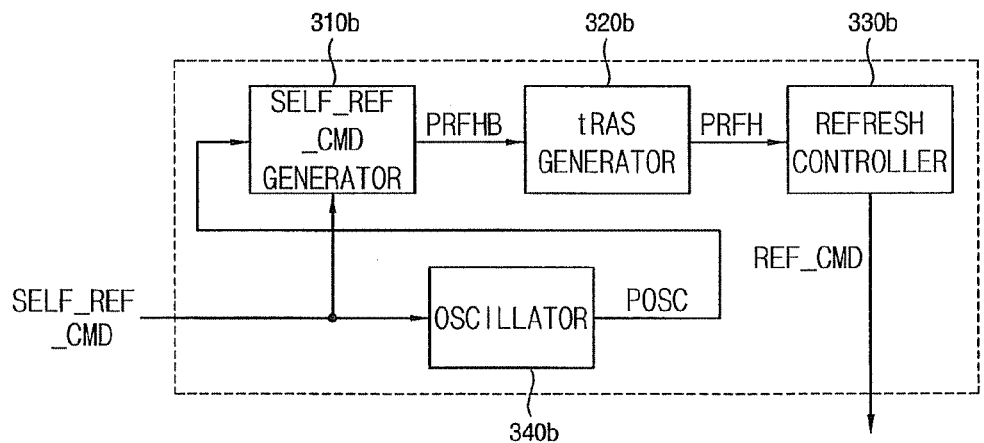
FIG. 10 is a block diagram illustrating another example of the refresh circuit in FIG. 1 according to some example embodiments.
Figure 11:
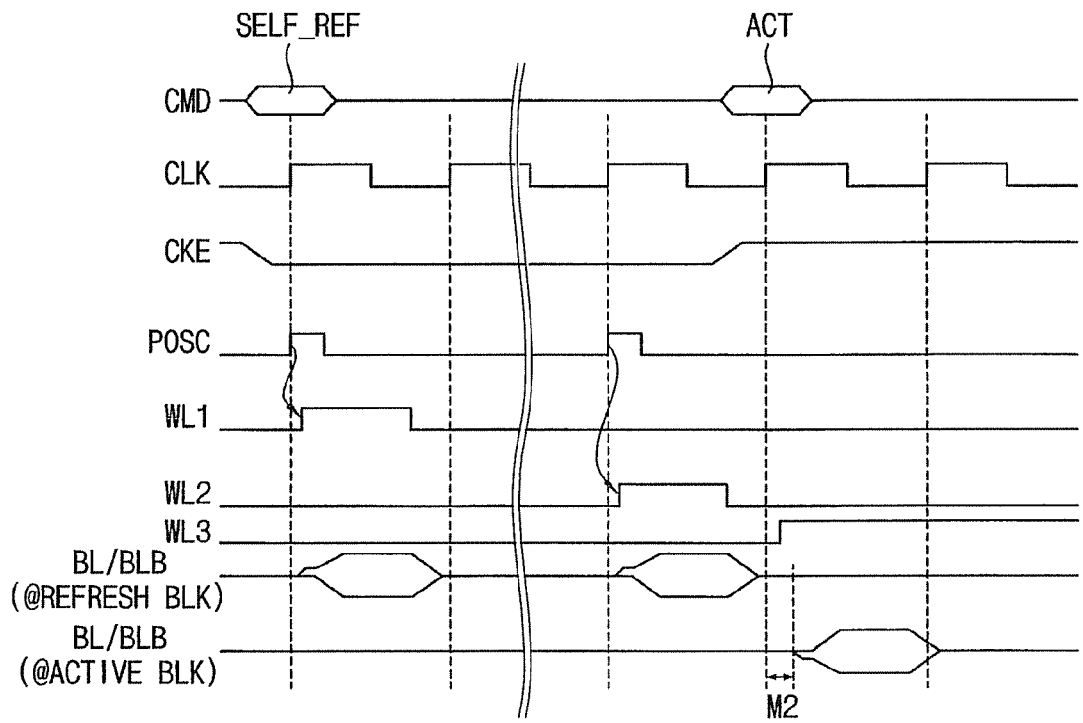
FIG. 11 is a timing diagram illustrating operation of the refresh circuit of FIG. 10 according to some example embodiments.
Figure 12:
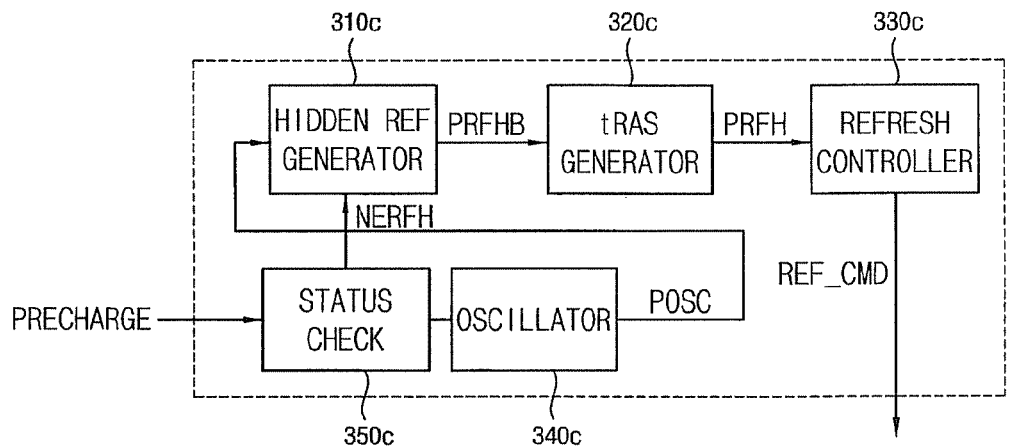
FIG. 12 is a block diagram illustrating another example of the refresh circuit in FIG. 1 according to some example embodiments.
Figure 13:
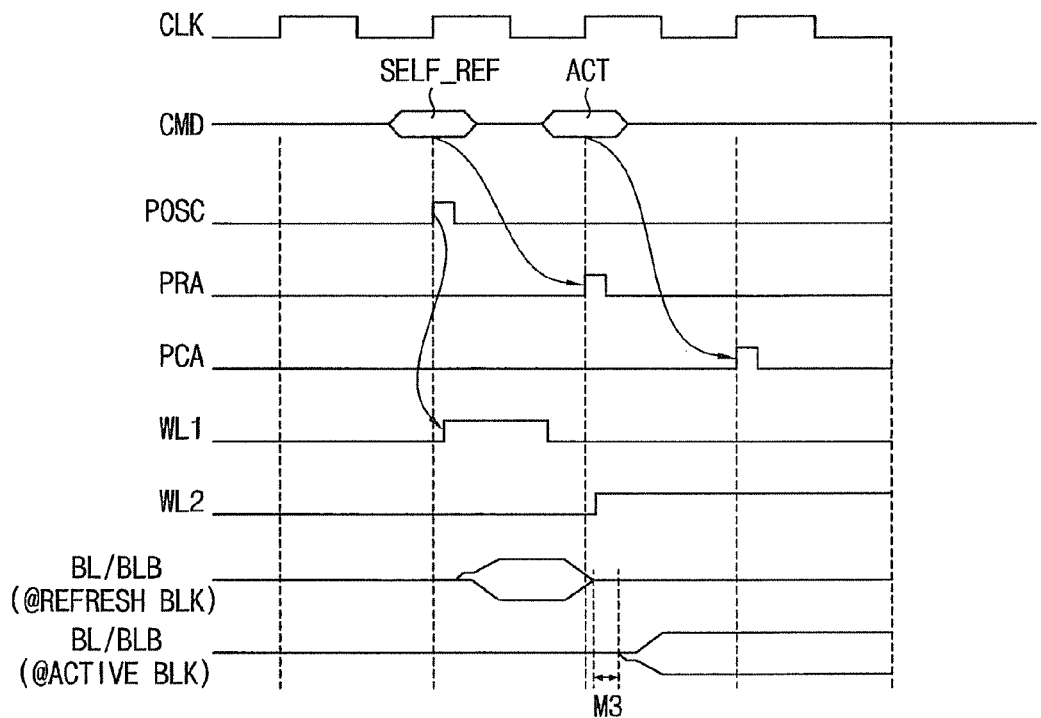
FIG. 13 is a timing diagram illustrating operation of the refresh circuit of FIG. 12 according to some example embodiments.

FIGS. 8, 10 and 12 are block diagrams respectively illustrating the refresh circuit in FIG. 1 according to some example embodiments, and FIGS. 9, 11 and 13 are timing diagrams respectively corresponding to FIGS. 8, 10 and 12 in the test mode.

In general, semiconductor memory devices have a poor or worst timing margin when a first row address to be refreshed for refresh operation and a second row address to be activated for read/write operation correspond to same bitlines. Therefore, this poor or worst case is assumed in the test mode for testing the semiconductor memory devices.

FIG. 8 is a block diagram illustrating refresh circuit 300a, an example of the refresh circuit 300 in FIG. 1 according to some example embodiments.

A refresh circuit 300a may be a refresh circuit for performing auto-refresh operation.

Referring to FIG. 8, the refresh circuit 300a may include an auto-refresh signal generating unit 310a, a row address strobe active time (tRAS) generating unit 320a and a refresh control unit 330a.

The refresh circuit 300a enters into an auto-refresh mode in response to the auto-refresh command AUTO_REF_CMD from the command decoder 10. The auto-refresh signal generating unit 310a generates a first refresh control signal PRFHB in response to the auto-refresh command AUTO_REF_CMD. The tRAS generating unit 320a activates the row address and transmits a second refresh control signal PRFH to the refresh control unit 330a. The refresh control unit 330a generates the refresh command REF_CMD for performing refresh operation in response to the second refresh control signal PRFH.

FIG. 9 is a timing diagram illustrating operation of the refresh circuit of FIG. 8 according to some example embodiments.

The auto-refresh operation is performed when all of the banks in the memory cell area 200 are in idle states. When the auto-refresh command AUTO_REF_CMD is received externally, corresponding wordline WL1 of the memory cell area 200 is enabled at a rising edge of a clock signal CLK, and thus a memory cell and a bit line is electrically connected. The memory cell connected to the bitline is charged and precharged after the being developed. The auto-refresh operation is performed only when the auto-refresh command AUTO_REF_CMD is received externally.

In general, the address for activating the wordline to be refreshed is automatically generated in the address counter 130 in the semiconductor memory device. However, according to some example embodiments, the active command for the read/write operation may be applied to the bitline BL/BLB @ACTIVE BLK which is the same bitline BL/BLB @REFRESH BLK on which the refresh operation is being performed. In this situation, a worst case of data failure may be tested because there is little margin M1 in tRP (row address strobe (RAS) to Precharge time) corresponding to a timing margin between precharging one bank (precharge command) and activating the bank (active command). That is, corresponding wordline WL2 is enabled at a rising edge of the clock signal CLK, and thus the corresponding bitline BL/BLB @ACTIVE BLK is connected to the memory cell. In such case, the data failure may be by increasing row refresh cycle timing (tRFC) corresponding to a timing margin between the auto-refresh and the active command.

FIG. 10 is a block diagram illustrating refresh circuit 300b, another example of the refresh circuit 300 in FIG. 1 according to some example embodiments.

A refresh circuit 300b may be a refresh circuit for performing self refresh operation.

Referring to FIG. 10, the refresh circuit 300b may include a self refresh signal generating unit 310b, a tRAS generating unit 320b, a refresh control unit 330b and a refresh oscillator 340b.

The refresh circuit 300b enters into a self refresh mode in response to the self refresh command SELF_REF_CMD from the command decoder 10.

The refresh oscillator 340b generates a refresh period pulse POSC having a regular period according to refresh period and refresh cycle of the semiconductor memory device. The self refresh signal generating unit 310b generates a first refresh control signal PRFHB in response to the self refresh command SELF_REF_CMD and the refresh period pulse POSC. The tRAS generating unit 320b activates the row address and transmits a second refresh control signal PRFH to the refresh control unit 330b. The refresh control unit 330b generates the refresh command REF_CMD for performing refresh operation in response to the second refresh control signal PRFH.

FIG. 11 is a timing diagram illustrating operation of the refresh circuit of FIG. 10 according to some example embodiments.

Referring to FIG. 11, the semiconductor memory device enters into the self refresh mode in response to the self refresh command SELF_REF_CMD and a clock enable signal CKF with logic low level. Wordlines WL1 and WL2 are activated and refreshed according to the internal address CNTi at a rising edge of the refresh period pulse POSC. The active command for the read/write operation may be applied to the bitline BL/BLB @ACTIVE BLK which is the same bitline BL/BLB @REFRESH BLK on which the refresh operation is being performed. In this situation, a worst case of data failure may be tested because there is little margin M2 in tRP (RAS to Precharge time) corresponding to a timing margin between precharging one bank (precharge command) and activating the bank (active command). That is, corresponding wordline WL3 is enabled at a rising edge of the clock signal CLK, and thus the corresponding bitline BL/BLB @ACTIVE BLK is connected to the memory cell. In such case, the data failure may be by increasing tRFC corresponding to a timing margin between the self refresh and the active command.

FIG. 12 is a block diagram illustrating refresh circuit 300c, another example of the refresh circuit 300 in FIG. 1 according to some example embodiments.

A refresh circuit 300c may be a refresh circuit for performing hidden refresh operation. The refresh circuit 300c may have some merits of the refresh operation being not associated with an external device such as a memory controller. The hidden refresh may be referred to as refresh operation which is performed without receiving the refresh command from the memory controller.

Referring to FIG. 12, the refresh circuit 300c may include a hidden refresh signal generating unit 310c, a tRAS generating unit 320c, a refresh control unit 330c, a refresh oscillator 340c and a status checking unit 350c.

The status checking unit 350c checks whether the memory cell area 200 is in precharged state or in active state in response to an operation command such as a precharge command PRECHARGE from the command decoder 10. The refresh oscillator 340c generates a refresh period pulse POSC having a regular period. The hidden refresh signal generating unit 310c generates a first refresh control signal PRFHB in response to the refresh period pulse POSC. The status checking unit 350c checks also generates a hidden refresh entry prohibition signal NERFH to be provided to the hidden refresh signal generating unit 310c. When the hidden refresh entry prohibition signal NERFH is activated, the refresh circuit 300c may not enter into a hidden refresh mode. Therefore, the hidden refresh signal generating unit 310c receives the refresh period pulse POSC and the hidden refresh entry prohibition signal NERFH, enables the first refresh control signal PRFHB at logic low level when the refresh period pulse POSC transitions to logic high level prior to the hidden refresh entry prohibition signal NERFH, and delays enablement of the first refresh control signal PRFHB until read or write operation on the memory cell area is completed when the hidden refresh entry prohibition signal NERFH transitions to logic high (enabled) level prior to the refresh period pulse POSC.

The tRAS generating unit 320c activates the row address and transmits a second refresh control signal PRFH to the refresh control unit 330c. The refresh control unit 330c generates the refresh command REF_CMD for performing refresh operation in response to the second refresh control signal PRFH.

As mentioned above, the hidden refresh entry prohibition signal NERFH and the refresh period pulse POSC are not synchronized with respect to each other, each activation time of the hidden refresh entry prohibition signal NERFH and the refresh period pulse POSC may be different according to various situations. Therefore, timing gap between the command input and data output may be varied whether the refresh operation intervenes with the read or write operation on the memory cell area.

FIG. 13 is a timing diagram illustrating operation of the refresh circuit of FIG. 12 according to some example embodiments.

In the hidden refresh operation, the external device such as the memory controller is not involved in the refresh operation. Therefore, tRFC corresponding to a timing margin between the self refresh and the active command may not be adjusted in the hidden refresh operation. For example, when the active command ACT_CMD transmitted externally and the refresh command REF_CMD are applied with a little timing gap, the commands are executed according to timing sequence of the applied commands.

For example, when the refresh period pulse POSC transitions to logic high level before the active command ACT_CMD is transmitted, operation according to the active command ACT_CMD is performed after the hidden refresh operation is performed. In this situation, a worst case of data failure may be tested because there is little margin M3 in tRP (RAS to Precharge time) corresponding to a timing margin between precharging one bank (precharge command) and activating the bank (active command). Wordline WL1 is activated at a rising edge of the refresh period pulse POSC, and the refresh operation is performed on the bitline (BL/BLB @REFRESH BLK). Read command READ_CMD is applied, corresponding wordline WL2 is maintained at an enabled state for performing operation according to the Read command READ), and the bitline (BL/BLB @ACTIVE BLK) on which the read operation will be performed is connected to the memory cell. In this case, the row address control circuit 100 according to some example embodiments may control the row address externally in the test mode for setting address to be activated and address to be refreshed to same bitlines. In FIG. 13, PRA denotes an internal active command according to the active command ACT_CMD and PCA denotes an internal command according to the read command READ_CMD.

Figure 14:
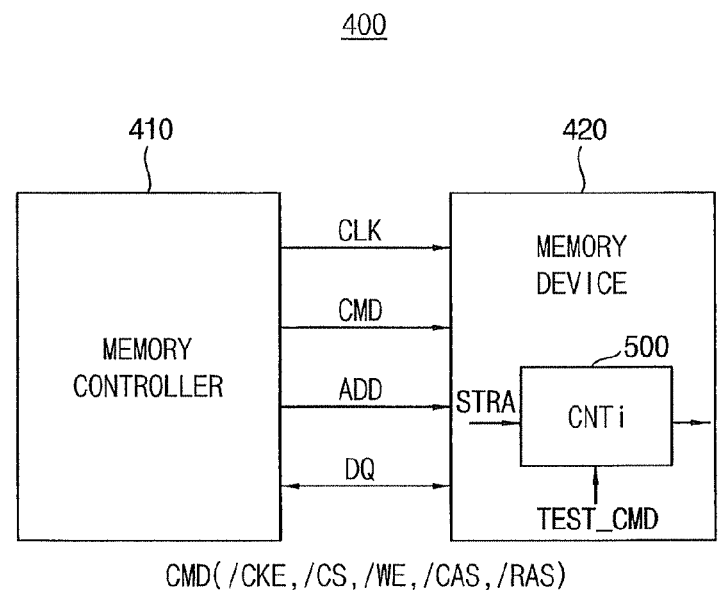
FIG. 14 is a block diagram illustrating a memory system according to some example embodiments.

FIG. 14 is a block diagram illustrating a memory system according to some example embodiments.

Referring to FIG. 14, a memory system 400 includes a memory controller 410 and a semiconductor memory device 420. The memory controller 410 transmits a command CMD and an address ADD in response to a clock signal CLK. The semiconductor memory device 420 receives data DQ in response to the clock signal CLK, and output the data DQ to the memory controller 410 in response to the clock signal CLK. The clock signal CLK may be a data strobe signal DQS or a write clock signal WCK. The command CMD may indicate operation to be performed based on combination of various control signals /CKE, /CS, /WE, /CAS and /RAS. For example, the CMD may indicate refresh command REF_CMD, active command ACT_CMD or precharge command PRE_CMD according to the combination of various control signals /CKE, /CS, /WE, /CAS and /RAS.

The semiconductor memory device 420 may employ the semiconductor memory device 5 of FIG. 1. Therefore, the semiconductor memory device 420 may include a row address control circuit 500. The row address control circuit 500 may select one of the external address STRA decoded from the address signal ADD and the internal address CNTi internally generated as the row address XADD to be refreshed, according to the logic level of the test mode signal TMS which is set by the test command TEST_CMD. As described above with reference to FIG. 1, the row address control circuit 500 selects the internal address CNTi when the test mode signal TMS has the first logic level indicating the normal mode, and the row address control circuit 500 selects the external address STRA when the test mode signal TMS has the second logic level indicating the test mode. Therefore, the memory system 400 may control the row address externally in the test mode for setting address to be activated and address to be refreshed to same bitlines.

Figure 15:
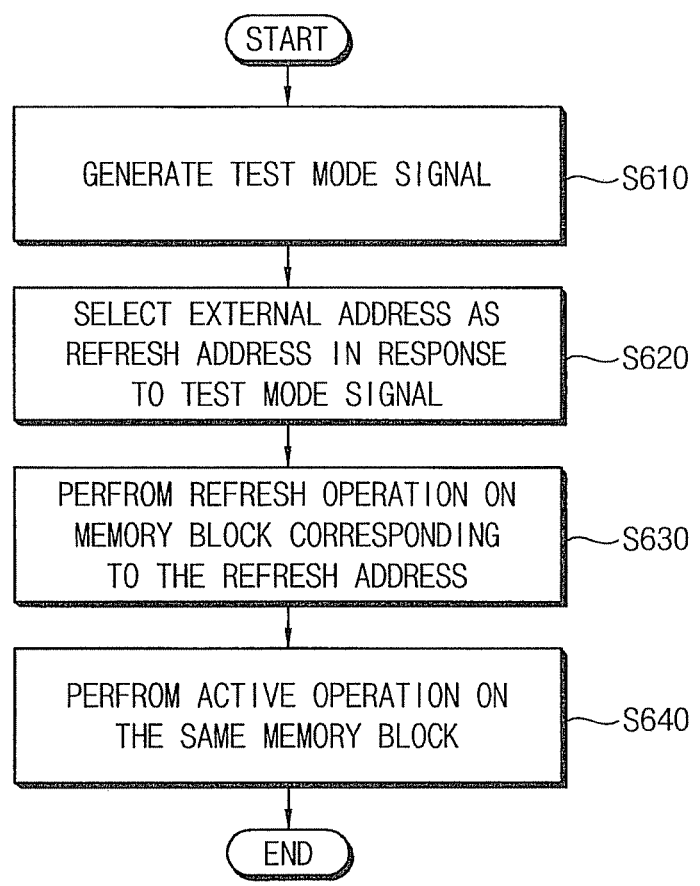
FIG. 15 is a flow chart illustrating a method of controlling a row address of a semiconductor memory device according to some example embodiments.

FIG. 15 is a flow chart illustrating a method of controlling a row address of a semiconductor memory device according to some example embodiments.

Hereinafter, a method of controlling a row address of a semiconductor memory device will be described with reference to FIGS. 1, 2, 13 and 15.

Referring to FIG. 15, in step S610 the test mode signal TMS is generated in a test command TEST_CMD in the test mode setting unit 120. In step S620, one of the internal address CNTi and the external address STRA is selected as the refresh address XADD in response to the test mode signal TMS in the row address generating unit 11]. In step S630, the refresh address XADD is decoded in the row decoder 30 and the refresh operation is performed on corresponding memory block in the memory cell area 200. In step S640, whether the memory block has defects or not is determined by performing the active (read/write) operation on the same memory block on which the refresh operation was performed.

The method of controlling a row address of a semiconductor memory device illustrated in FIG. 15 is a representation of the same as the operation of the row address control circuit described above with reference to FIGS. 1 to 13. Thus, for the purpose of simplicity, further description on the method of controlling a row address of a semiconductor memory device illustrated in FIG. 15 is omitted.

As mentioned above, the row address control circuit and the semiconductor memory device according to some example embodiments may control the row address to be refreshed externally in the test mode, and thus, are capable of decreasing test time and enhancing performance by performing test with a reduced or minimum timing margin between the refresh operation and the normal operation. Therefore, the row address control circuit and the semiconductor memory device according to some example embodiments may be applicable to various memory fields.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A row address control circuit of a semiconductor memory device including dynamic memory cells, the row address control circuit comprising:
   a test mode setting unit configured to provide a test mode signal that indicates whether a test operation is performed or not, in response to a test command;
   an address counter configured to generate a first address that increases gradually; and
   a row address generating unit configured to selectively choose one of the first address and a second address as a refresh address based on the test mode signal, the second address being externally provided,
   wherein the row address generating unit is configured such that the row address generating unit operates in a normal mode when the test mode signal has a first logic level, and the row address generating unit operates in a test mode when the test mode signal has a second logic level, and
   wherein, the row address generating circuit is configured such that, when the test mode signal has the second logic level, a refresh operation based on a refresh command and an active operation based on an active command are both performed on a same bitline of the semiconductor memory device based on the externally provided second address.

2. The row address control circuit of claim 1, wherein the row address generating unit includes a selection circuit configured to select the first address as the refresh address when the test mode signal has the first logic level, and to select the second address as the refresh address when the test mode signal has the second logic level.

3. The row address control circuit of claim 2, wherein the row address generating unit further comprises:
   a first switch configured to be turned on in response to an active command and to transfer the second address; and
   a second switch configured to be turned on in response to a refresh command and to transfer the refresh address output from the selection circuit.

4. The row address control circuit of claim 2, wherein the selection circuit comprises a multiplexer which has a first input terminal configured to receive the first address, a second input terminal configured to receive the second address and a control terminal configured to receive the test mode signal.

5. The row address control circuit of claim 2, wherein the selection circuit comprises:
   an inverter configured to receive the test mode signal;
   a first AND gate configured to receive an output of the inverter and the first address;
   a second AND gate configured to receive the test mode signal and the second address; and
   an OR gate configured to receive outputs of the first and second AND gates.

6. A semiconductor memory device comprising:
   a memory cell area including a plurality of dynamic memory cells;
   a refresh circuit configured to generate a refresh command; and
   a row address control circuit configured to generate a refresh address for performing refresh operation on the memory cell area, in response to the refresh command, the row address control circuit being configured to select a first address in a normal mode and to select a second address in a test mode, the first address being an address that is generated in the row address control circuit, the second address being an address that is input to the row address control circuit externally,
   wherein the row address generating unit is configured to output the second address in response to an active command for an active operation such that the refresh address generated for the refresh operation and the externally input second address output by the row address generating unit in response to the active command for the active operation designate a same memory block.

7. The semiconductor memory device of claim 6, wherein the memory cell area is divided into a plurality of banks, each of the banks includes a plurality of memory blocks, and the plurality of memory blocks are each associated with same bitlines and share a sense amplifier.

8. The semiconductor memory device of claim 7, wherein the row address generating unit is configured such that the row address generating circuit operates in the normal mode when the test mode signal has a first logic level, and the row address generating unit operates in the test mode when the test mode signal has a second logic level.

9. The semiconductor memory device of claim 6, wherein the refresh circuit is a hidden refresh circuit configured to generate the refresh command autonomously without regard to an external command.

10. The semiconductor memory device of claim 6, wherein the row address control circuit comprises:
    a test mode setting unit configured to provide a test mode signal in response to a test command; and
    a row address generating unit configured to selectively choose one of the first address and the second address as a refresh address based on the test mode signal.

11. A method of controlling refresh address of a semiconductor memory device including dynamic memory cells, the method comprising:
    generating a test mode signal in response to a test command;
    selectively choosing one of an external address and an internal address as a refresh address based on a test mode signal, the test mode signal indicating whether the semiconductor memory device is in a normal mode or a test mode;
    performing a refresh operation on a memory block corresponding to the refresh address; and
    performing an active operation on the memory block to determine whether the memory block has defects or not,
    wherein when the test mode signal indicates the semiconductor memory device is in the test mode,
        the selectively choosing includes choosing the external address as the refresh address for performing the refresh operation, and
        the external address selected as the refresh address for the refresh operation is also selected as an address for performing the active operation.

12. The method of claim 11, wherein the internal address is selected as the refresh address when the test mode signal has a first logic level, and the external address is selected as the refresh address when the test mode signal has a second logic level.

13. A row address control circuit of a semiconductor memory device including dynamic memory cells, the row address control circuit comprising:
- a row address generating unit configured to receive a first signal indicating a normal mode or a test mode, and configured to selectively choose one of a first address and a second address as a refresh address for performing a refresh operation based on the first signal, the first address being an address generated based on an internal counting operation, the second address being an externally provided address,
- wherein the row address generating circuit is configured such that, when the first signal indicates the test mode,
  - the externally provided second address chosen as the refresh address for performing the refresh operation is also chosen as an address for performing an active operation, and
  - the refresh and active operations are performed on a same bitline of the semiconductor memory device.

14. The row address control circuit of claim 13, further comprising:
- an address counter configured to perform the counting operation, and to generate the first address based on the counting operation; and
- a test mode setting unit configured to generate a test mode signal in response to a test command, the test mode signal indicating whether a test operation is to be performed or not, the test mode signal being the first signal.

15. A semiconductor memory device comprising:
- a memory cell area including a plurality of dynamic memory cells; and
- a row address control circuit configured to generate a refresh address for performing a refresh operation on memory cells from among the plurality of dynamic memory cells, the row address control circuit being configured to select a first address in a normal mode and configured to select a second address in a test mode, the first address being internally generated, the second address being input to the row address control circuit externally,
- wherein the row address generating circuit is configured such that, when the first signal indicates the test mode,
  - the externally input second address selected as the refresh address for performing the refresh operation is also selected as an address for performing an active operation, and
  - the refresh and active operations are performed on a same bitline of the semiconductor memory device.

16. The semiconductor memory device of claim 15, further comprising:
- a refresh circuit configured to generate the refresh command.

17. A method of controlling refresh address of a semiconductor memory device including dynamic memory cells, the method comprising:
- selectively choosing one of an externally received address and an internally generated address as a refresh address based on a test mode signal, the test mode signal indicating whether the semiconductor memory device is in a normal mode or a test mode; and
- performing a refresh operation on a memory block corresponding to the refresh address,
- wherein when the test mode signal indicates the semiconductor memory device is in the test mode,
  - the selectively choosing includes choosing the externally received address as the refresh address for the refresh operation,
  - the externally received address selected as the refresh address for the performing refresh operation is also selected as an address for performing an active operation, and
  - the refresh and active operations are performed on a same bitline of the semiconductor memory device.

18. The method of claim 17, further comprising:
- generating the test mode signal in response to a test command; and
- performing an active operation on the memory block after performing the refresh operation to determine whether the memory block has defects or not.

* * * * *